(12) United States Patent
Lamure

(10) Patent No.: US 6,576,065 B1
(45) Date of Patent: Jun. 10, 2003

(54) INSTALLATION AND METHOD FOR CHEMICAL TREATMENT OF MICROELECTRONICS WAFERS

(75) Inventor: Jean-Michel Lamure, St-Jean-le-Vieux (FR)

(73) Assignee: S.O.I.Tech Silicon On Insulator Technologies, Bernin (FR)

( * ) Notice: Subject to any disclaimer, the term of this patent is extended or adjusted under 35 U.S.C. 154(b) by 0 days.

(21) Appl. No.: 09/622,928

(22) PCT Filed: Mar. 9, 1999

(86) PCT No.: PCT/FR99/00520
§ 371 (c)(1),
(2), (4) Date: Sep. 8, 2000

(87) PCT Pub. No.: WO99/46802
PCT Pub. Date: Sep. 16, 1999

(30) Foreign Application Priority Data

Mar. 9, 1998 (FR) .............................................. 98 02833

(51) Int. Cl.⁷ .............................. B08B 3/00; B08B 7/00
(52) U.S. Cl. ................................ 134/2; 134/76; 134/83; 118/423; 118/428; 118/503
(58) Field of Search .......................... 118/423, 428, 118/503; 134/2, 3, 76, 83, 115 R, 137, 105, 200, 902

(56) References Cited

U.S. PATENT DOCUMENTS

| | | | | |
|---|---|---|---|---|
| 5,301,700 A | * | 4/1994 | Kamikawa et al. | 134/102.3 |
| 5,657,879 A | | 8/1997 | Anderson et al. | 211/41.18 |
| 5,853,496 A | * | 12/1998 | Honda | 118/429 |
| 6,001,191 A | * | 12/1999 | Kamikawa et al. | 134/2 |
| 6,158,449 A | * | 12/2000 | Kamikawa | 134/140 |
| 6,199,564 B1 | * | 3/2001 | Yokomizo | 134/135 |

FOREIGN PATENT DOCUMENTS

DE          43 00 205          7/1994

* cited by examiner

Primary Examiner—Frankie L. Stinson
Assistant Examiner—Joseph Perrin
(74) Attorney, Agent, or Firm—Winston & Strawn

(57) ABSTRACT

The invention relates to an installation for treating wafers made of materials serving as microelectronics substrates including a tank for containing a treatment bath, a wafer support device capable of receiving at least one wafer of a first size, and an element for grasping and placing each wafer of the first size in the bath and for removing it therefrom. The installation further includes a support for receiving at least one wafer of a second size that is smaller than the first size, the shape of the support allowing it to be grasped by the grasping element and received by the wafer support device in the tank.

16 Claims, 6 Drawing Sheets

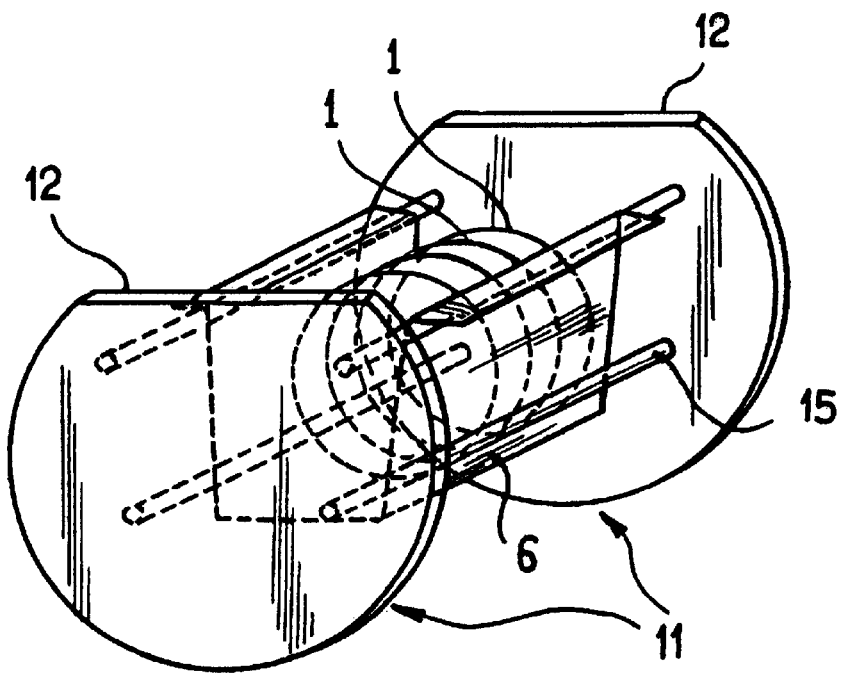
FIG_8
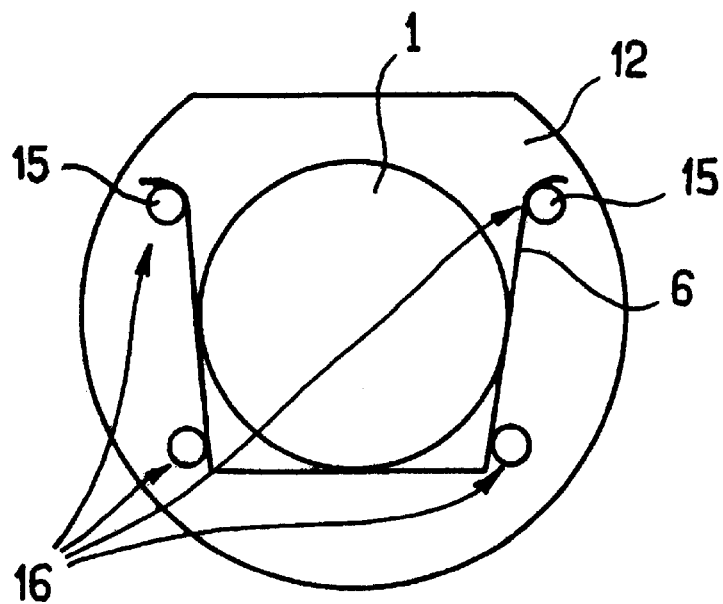
FIG_9

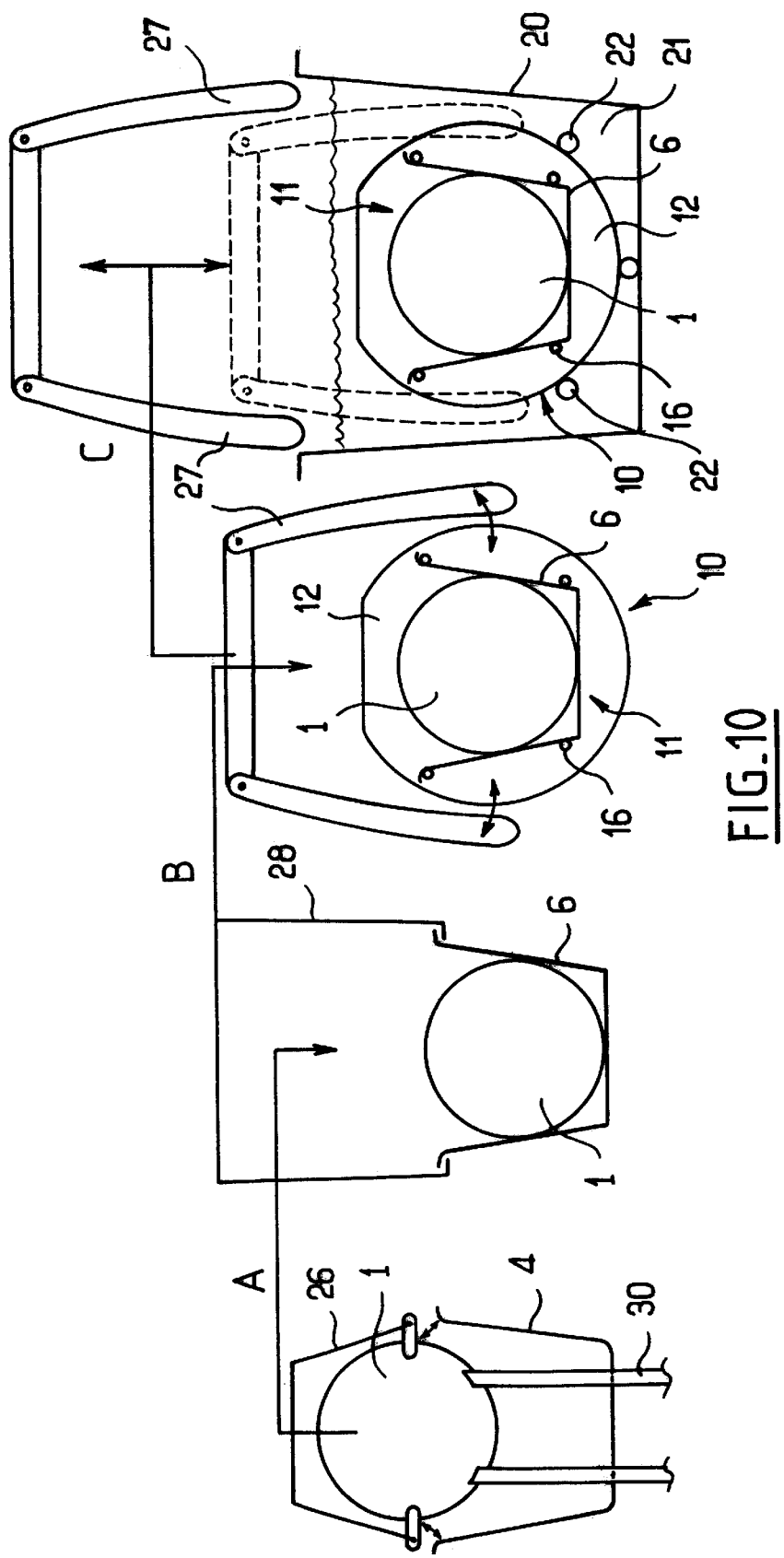

INSTALLATION AND METHOD FOR CHEMICAL TREATMENT OF MICROELECTRONICS WAFERS

FIELD OF THE INVENTION

The present invention relates to the field of microelectronics. It relates more particularly to the field of installations for treating wafers of materials used as substrates for the fabrication of microelectronic components and in particular chemical treatment installations.

BACKGROUND ART

To be more precise, the present invention relates to the field of installations and methods for treating and manipulating wafers, in particular in the context of methods of manipulating wafers without using a cassette, which type of installation is often referred to as a "cassetteless" installation. It is nevertheless also directed to certain manipulations using cassettes that receive wafers.

The document U.S. Pat. No. 5,657,879 discloses a cassette for receiving wafers including plates for adjusting the capacity of the cassette and sleeves, also in the form of cassettes, for adapting the cassette to receive wafers with different dimensions.

The document DE 45 00 205 discloses a cassette for receiving wafers including an adaptor for receiving wafers with different dimensions.

Chemical treatment of wafers for microelectronics generally necessitates the immersion of the wafers in baths of chemical products, some of which are corrosive.

In cassetteless installations for manipulating and treating wafers, the wafers are initially disposed in batches of 25 in a manipulation and storage cassette, for example, and are removed from the cassettes and immersed successively in different chemical baths. Between the baths, the wafers are grasped by special combs in order to be transferred from one chemical bath to another. In each bath the wafers are disposed on wafer supports which are intended to remain permanently in the chemical bath.

The wafers are deposited on wafer supports specific to each tank and the combs do not remain in the tanks during treatment. This type of installation enables the chemical treatment to be optimized by adapting the wafer supports in each tank. The wafer supports can have a very small volume and surface area to interfere with the treatment as little as possible.

This type of installation avoids contamination of the baths by the chemical products which remain on the baskets or cassettes if baskets or cassettes are used to transfer wafers from one tank to another. What is more, there can be a multiplicity of transfer combs, for example, to avoid the combs being dipped successively into chemically incompatible baths. They can also be rinsed while the wafers are undergoing chemical treatment. However, this type of installation is unable to treat several sizes of wafers using the same system. The comb system is already difficult to adjust mechanically to guarantee proper holding of wafers of a single type, and therefore there is no question of achieving an adjustment enabling satisfactory holding of wafers of several types, i.e. several sizes.

SUMMARY OF THE INVENTION

The present invention provides an economic way of treating more than one type of wafer in the above type of installation.

This is achieved by an installation for treating wafers of a material used as a substrate for microelectronics, the installation comprising:

- a tank adapted to contain a treatment bath and provided with wafer support means, preferably in the form of a wafer support device that is adapted to receive at least one wafer of a first size;
- holding means, preferably in the form of a grasping element that is adapted to grasp each first size wafer to place it in the tank and withdraw it therefrom; and
- a support that is adapted to receive at least one wafer of a second size less than the first size, which support has a geometry such that it can be grasped directly by the holding means and received by the wafer support means of the tank.

Thus, even if an installation according to the invention is dedicated to treating wafers of a first size, it is possible to effect chemical treatment of wafers of a second size smaller than the first size.

BRIEF DESCRIPTION OF THE INVENTION

For example, if the installation is dedicated to treating 20 cm diameter wafers, the grasping means, for example combs, are adjusted for that diameter and the tanks are provided with wafer supports adapted to receive wafers of that size.

The installation can nevertheless also be used to treat 10 cm diameter wafers, for example, because all that is required is to place the 10 cm diameter wafers in a support having a geometry such that it can be grasped by the combs.

That geometry is advantageously determined by manipulator plates whose shape is similar to that of a wafer of the first size, i.e. has a diameter of 20 cm, in the example described above.

It is even more advantageous for the support to include two manipulator plates joined together by strips adapted to hold a batch of wafers of the second size, either directly or through the intermediary of a cassette.

In another aspect, the invention proposes a method of treating wafers of materials used as substrates for microelectronics, including a step of employing holding means originally designed to grasp at least one wafer of a first size and to immerse each wafer in a treatment bath contained in a tank provided with wafer support means adapted to receive at least one wafer of said first size, characterized in that it alternately includes a step of using the same holding means to grasp a support adapted to receive at least one wafer of a second size, less than the first size, and to immerse the second size wafers in the treatment bath by depositing said support in said tank so that it cooperates with said wafer support means.

Other aspects, objects and advantages of the invention will become apparent after reading the following detailed description, which is given by way of non-limiting example only and with reference to the accompanying drawings, in which.

Figure 5:
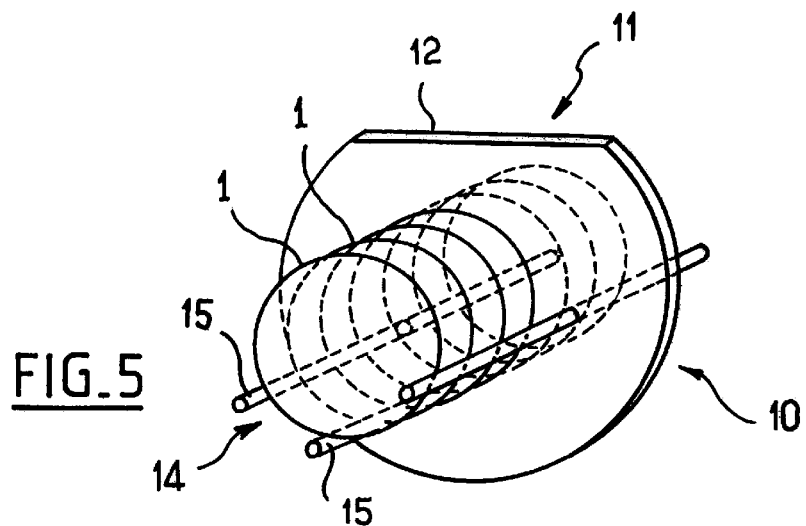
Figure 6:
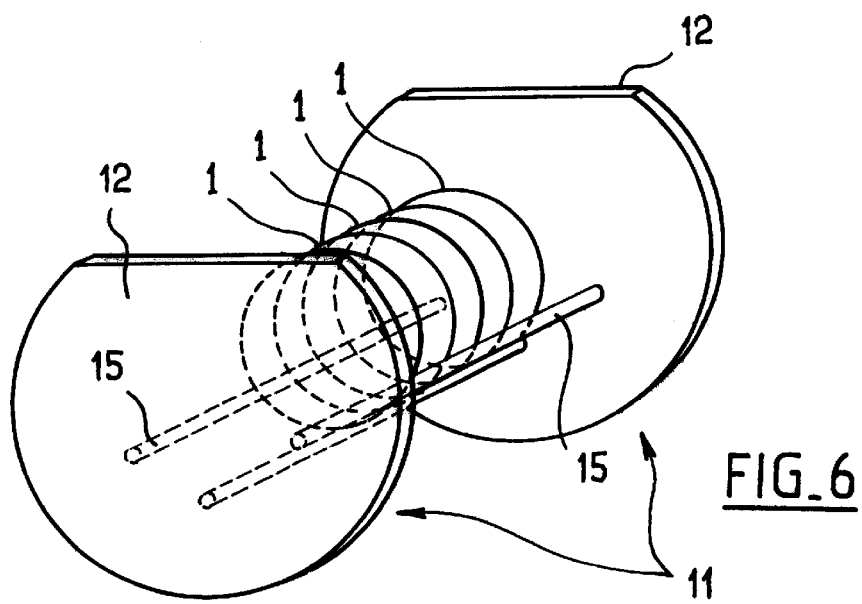
Figure 7:
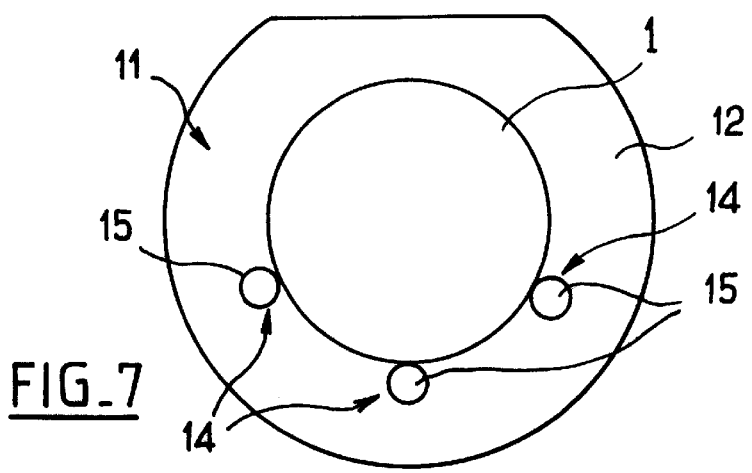

FIG. 4 is a schematic representation of the wafer support members and various embodiments of the edge of the means of manipulating supports according to the invention; FIGS. 4a and 4b respectively show, in section, multiple and single support members; FIGS. 4c to 4e show in section various shapes of edge adapted to cooperate with the support members; and FIG. 4f shows a support according to the invention in end elevation, with an edge of the type shown in FIG. 4e, and interengaged with transfer combs;

FIG. 5 is a perspective view of one non-limiting example of a support according to the invention;

FIG. 6 is a perspective view of another non-limiting example of a support according to the invention;

FIG. 7 is a diagrammatic partial end view of the support according to the invention shown in FIG. 6;

FIG. 8 is a perspective view of another embodiment of a support according to the invention;

FIG. 9 is a diagrammatic partial end-view of the support showing FIG. 8; and

Figure 11:
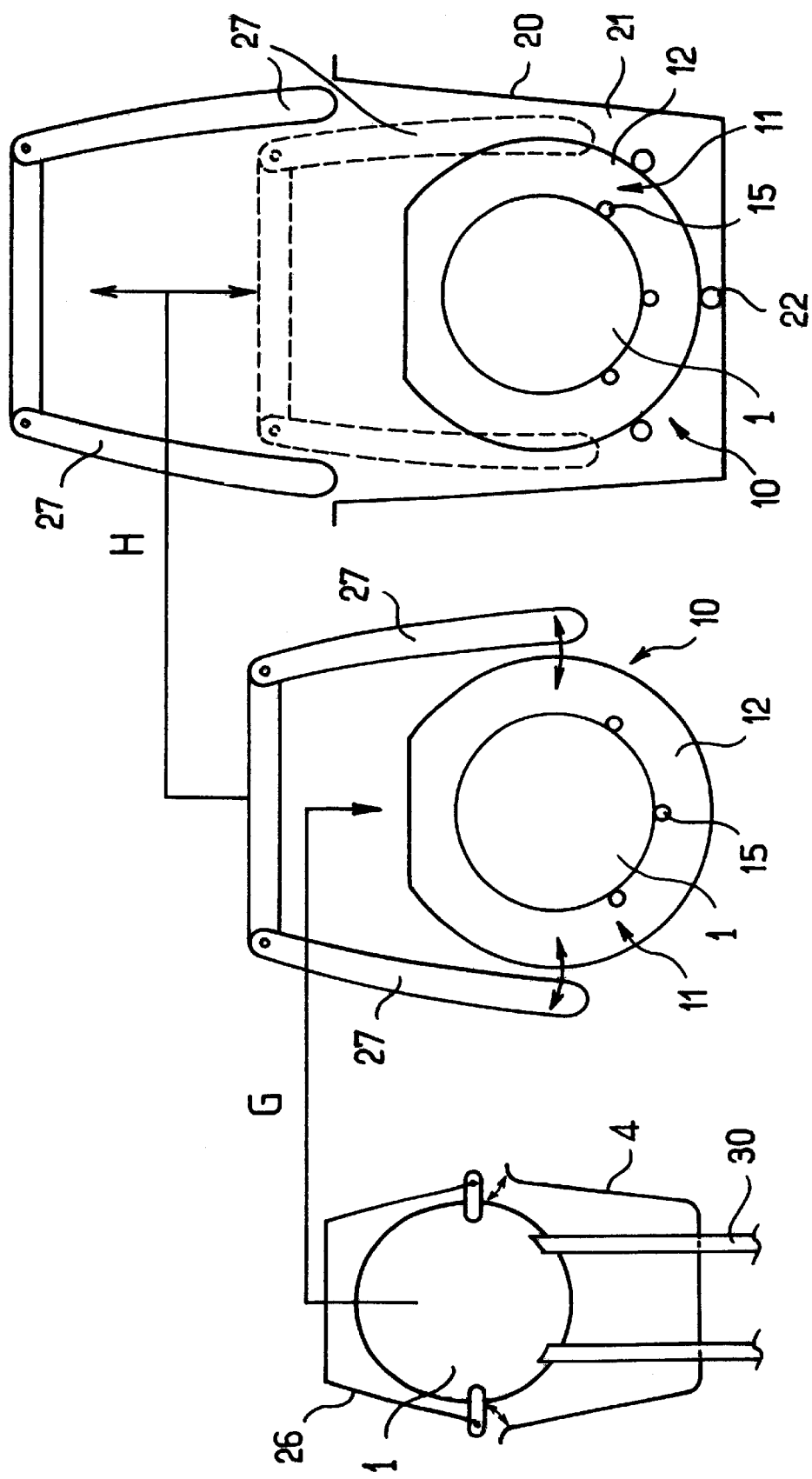

FIGS. 10 and 11 are diagrammatic representations of different embodiments of utilizing supports according to the invention.

DETAILED DESCRIPTION OF PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to the skilled artisan from this detailed description.

Manufacturers of microelectronic components use wafers of materials such as silicon, quartz, glass, etc. Generally speaking, although this is not limiting on the invention, the material can be a semiconductor, ceramic or plastics material. The wafers are usually round and thin. For silicon, for example, the diameter of the wafers 1 is typically 10 cm (4 inches), 12.5 cm (5 inches), 15 cm (6 inches), 20 cm (8 inches) or 30 cm (12 inches). However, the present invention is compatible with other shapes of the wafers 1. For example, the wafers can have shapes of the kind used to fabricate flat screens.

According to the invention, the wafers undergo a number of technological process steps to form electronic, optical or opto-electronic components. Such processes comprise one or more operations in which the wafers are chemically treated in liquid chemical baths 21.

The baths 21 are typically mixtures of acids, bases, solvents or de-ionized water and rinsing solutions. The baths 21 are contained in tanks 20 fed automatically with chemical products from a centralized product distribution system. The tank 20 can be heated and activated by ultrasound or megasound. The tanks 20 are generally grouped together on a chemical treatment system for automatically transporting the wafers from one tank to another, starting from a loading and/or transfer station and ending at an offloading station.

The wafers are advantageously chemically treated in batches, for example batches of 25. Before and after the chemical treatment steps the batches of wafers are manipulated and stored in first storage boxes 5.

Figure 1:
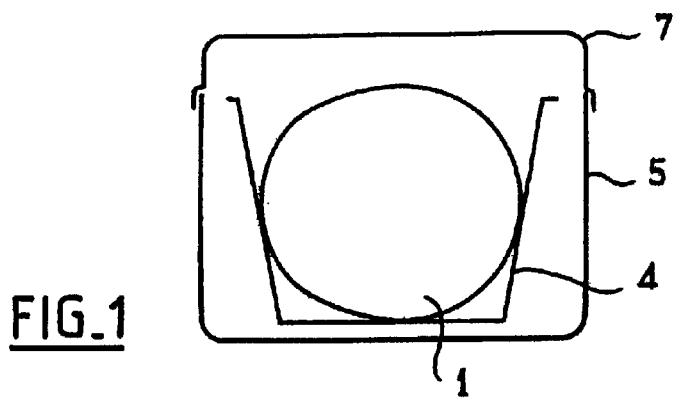
FIG. 1 is a diagrammatic sectional representation of a wafer storage box.

FIG. 1 shows that the first storage boxes 5 are closed by a lid 7 and contain a manipulation and storage cassette or box 4 in which the wafers are stored. The manipulation and storage cassettes 4 are made from a plastics material that is incompatible with the nature of the chemical treatment baths generally employed.

In one particular embodiment of the method according to the invention an installation dedicated to 20 cm diameter wafers is used for chemical treatment of 10 cm diameter wafers using a support 10 described below.

The following detailed description refers to 10 cm diameter wafers 1 and 20 cm diameter wafers 2.

Figure 2:
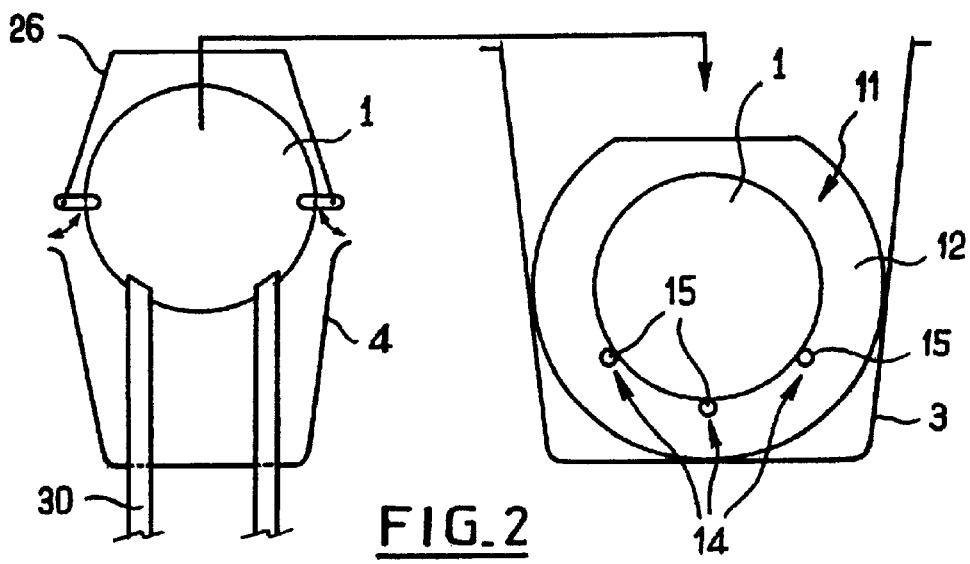
FIG. 2 is a diagrammatic representation of the transfer of wafers from a storage and manipulation cassette to a support according to the invention.

FIG. 2 shows how a transfer system 30 removes the 10 cm diameter wafers 1 from the manipulation and storage cassette 4. The transfer means 26 then interengage with and move the 10 cm diameter wafers 1 and deposit them in a support 10. The support 10 can then be deposited in a second manipulation and storage cassette 3 which can itself be stored in another box to await chemical treatment of the wafers 1, for example.

The second manipulation and storage cassette 3 is advantageously identical to those adapted to receive the 20 cm diameter wafers 2.

As a general rule, the support 10 must be compatible with the physical and/or chemical treatments mentioned above and must not contaminate the wafers 1. The support 10 is advantageously made from a very pure and chemically inert material such as quartz or various plastics material and fluorinated products. A support 10 of this kind comprises holding members 11 and members 14 for retaining the wafers 1 on the support 10. By way of non-limiting example, the holding members 11 comprise a pair of holding plates 12 and the retaining members 14 consist of bars 15.

Figure 3A:
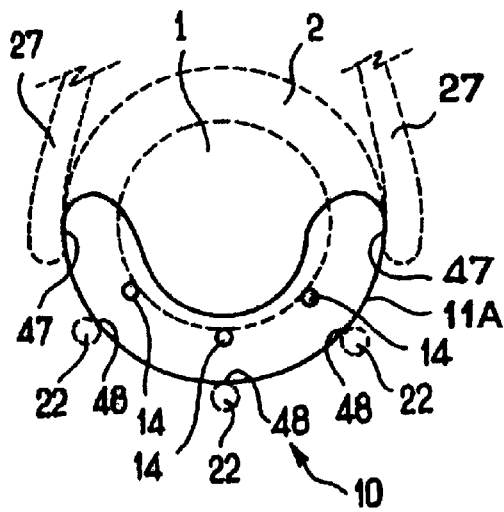
FIG. 3 is a schematic representation in end elevation of two variants (FIGS. 3a and 3b) of means of manipulating the support according to the invention.
Figure 3B:
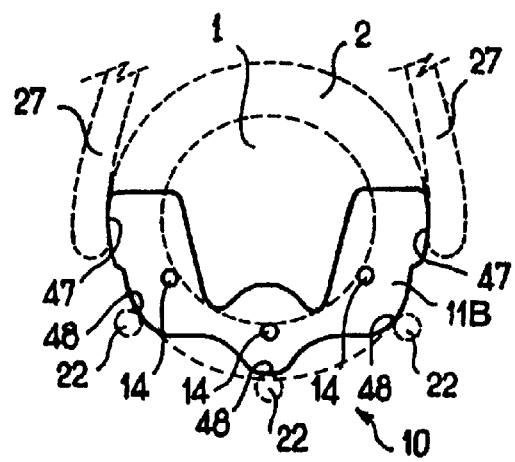

In accordance with the present invention, the support 10 is intended to enable equipment for manipulating 20 cm diameter wafers 2 to be used to treat 10 cm diameter wafers 1. The holding members 11 must therefore have a shape compatible with that equipment, since it is the holding members 11 that manipulate the supports 10. For example, if two transfer combs 27 are adapted to interengage with two diametrally opposite areas of the 20 cm diameter wafers 2, the transfer combs 27 must also be able to interengage with the holding members 11, which must also have two diametrally opposed holding areas 47 separated by a distance of approximately 20 cm (FIGS. 3a and 3b). Similarly, for it to be possible for the support 10 to be deposited on the bottom of the tanks 20, on wafer supports 22 designed to receive 20 cm diameter wafers 2, the holding members 11 must have bearing areas 48 such that the support 10 can rest on the wafer supports 22 (FIGS. 3a and 3b).

In a basic embodiment, the holding members 11 have dimensions (diameter and thickness) identical to those of the wafers 2 so that they can be grasped by the transfer combs 27 originally designed to grasp such wafers 2 and locate in storage boxes originally designed to receive such wafers 2.

However, the shape of the holding members 11 can be different, and optimized so that the chemical treatments are effective and homogeneous, while complying with the disposition and the geometry of the holding areas 47, the bearing areas 48 and the retaining members 14. FIGS. 3a and 3b show two embodiments of such holding members 11A, 11B. FIGS. 3a and 3b also show in dashed outline the position that a larger wafer 2 to be treated would assume in the transfer combs 27.

If the holding members 11 are thicker than the wafers 2, they advantageously have, at least in the holding areas 47 and bearing areas 48, an edge 43 adapted to cooperate with the storage and manipulation cassettes 3, the transfer means 26, the cransfers combs 27 and the wafer supports 22.

The storage and manipulation cassettes 3, the transfer means 26, the transfer combs 27 or the wafer support members 22 generally have grasping parts 40 provided with notches 41. There can be a series of notches 41 on each grasping part 40 (FIG. 4a) or a single notch 41 on each grasping part 40 (FIG. 4b).

Figure 4A:
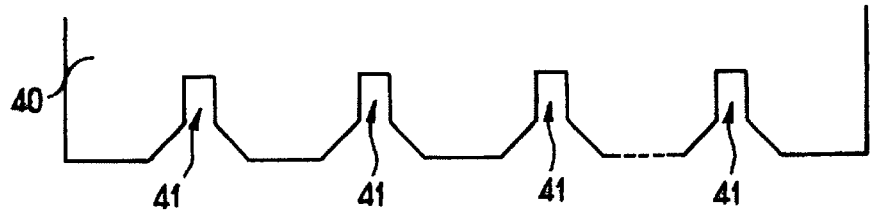
Figure 4B:
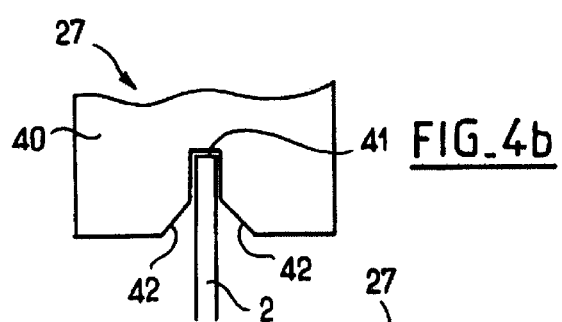
Figure 4C:
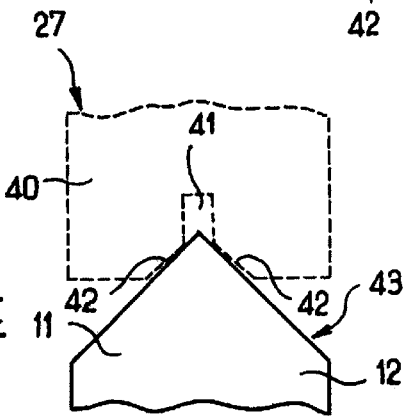
Figure 4D:
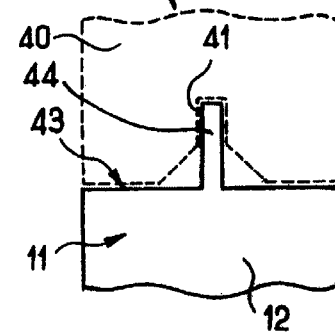
Figure 4E:
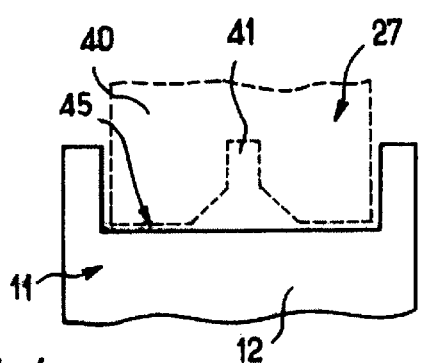
Figure 4F:
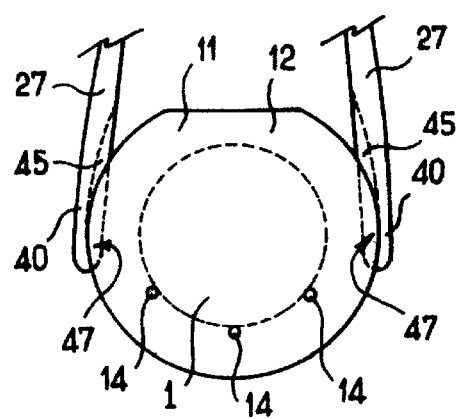

As shown in FIG. 4b in particular, a notch 41 has a profile adapted to locate a wafer 1. Chamfers 42 are provided on each side of each notch 41 to guide the wafers 1 towards the notch 41. If the holding members 11 are thicker than a wafer 2, they cannot enter directly into the notches 41 of the transfer combs 27. The edge 43 of the holding members 11 is then shaped to cooperate closely and securely with the grasping parts 40. Thus the edge 43 can also be chamfered to cooperate with the chamfers 42 on the grasping parts 40 (FIG. 4c). In one variant the edge 43 can also be flat and comprise a projecting member 44 (FIG. 4d). The projecting member 44 then has a thickness equal to that of a wafer 1. In another variant, the edge 43 of the holding members 11 can comprise a groove 45 which the whole of the grasping part 40 can enter (FIG. 4e). FIG. 4f shows a holding plate 12 interengaged with transfer combs 27, in conformance with the latter variant. The edges of the groove 45 overlap the transfer combs 27 locally, in the area 47 where the holding plate 12 is held by the transfer combs 27.

In one particular but non-limiting embodiment of the support 10, shown in FIG. 5, the support comprises a single vertical holding plate 12 and three horizontal bars 15. The holding plate 12 is placed in the middle of the bars 15 and perpendicular to them. The bars 15 are rigidly joined to the holding plate 12. The 10 cm diameter wafers 1 are disposed on the three bars 15 on each side of the holding plate 12 and parallel to the holding plate 12. The three bars 15 have notches 41 regularly spaced along their length.

The preferred embodiment of the support 10, as described in outline above, is shown more clearly in FIGS. 6 and 7, which show the two vertical holding plates 12 and the three horizontal retaining bars 15, forming a rigid assembly. The first type wafers 1 are disposed on 35 the bars 15 between and parallel to the two holding plates 12.

In another embodiment of the support 10, shown in FIGS. 8 and 9, the support comprises two holding plates 12 and four bars 15. Each end of a bar 15 is on the inside face 13 of a holding plate 12, at one of four corners of a trapezium. Disposed in this way, the bars 15 constitute a cassette support member 16 adapted to receive and retain a cassette 6 grouping a series of wafers 1 for treatment.

Supports 10 comprising one or two holding plates 12 and three or four bars 15 are described above. Obviously other variants of the support 10 can comprise more than two holding plates 12 or a different number of bars 15, or other types of bearing members 14, 15 for the wafers 1, for example continuous or discontinuous concave surfaces.

Two embodiments of a method in accordance with the present invention utilizing supports 10 as described above will now be described.

The first embodiment is shown diagrammatically in FIG. 10 and uses a support as described with reference to FIGS. 8 and 9. In a first step A the first type wafers 1 are removed from the manipulation and storage cassettes 4 by transfer means 26, 30 known in the art. The first type wafers 1 are raised by the means 30, grasped by the means 26 and deposited in a treatment cassette 6 (step A). A cassette transfer system 28 engages with and moves the treatment cassette 6 and deposits it in a support 10, as shown in FIGS. 8 and 9 (step B). Transfer combs 27, originally designed for grasping and moving larger wafers 2, can then interengage with the holding plates 12 in a step C to move the support 10 carrying the cassette 6 containing the wafers 1 toward a tank 20. The tank 20 contains a chemical treatment bath 21. The support 10 is put down on the bottom of the tank 20 with its holding plate 12 resting on wafer support rods 22 originally designed to receive larger wafers 2. The transfer combs 27 are advantageously withdrawn from the tank 20 during the chemical treatment and can be rinsed if necessary. After the chemical treatment is finished, the transfer combs 27 grasp, raise and move the support 10. The support 10 can be moved towards a new chemical treatment tank. At the end of the chemical treatment operations, steps A, B and C described above can be repeated in the reverse chronological order, before offloading and/or storing the first type wafers 1.

A second embodiment of a method according to the present invention is described below with reference to FIG. 11. It comprises two main steps G and H. During step G, 10 cm diameter wafers 1 are transferred from a manipulation and storage cassette 4 to a support 10 using transfer means 26, 30. Transfer combs 27 originally designed to grasp and move larger wafers 2 then interengage with the holding plates 12 to lift and move the support 10 towards a tank 20 on the bottom of which the support 10 is placed, resting on wafer support rods 22, which were also originally designed to receive larger wafers 2 (step H) The tank 20 contains a chemical treatment bath. The transfer combs 27 are preferably withdrawn from the tank 20 and rinsed while the treatment of the wafers 1 is taking place. Then either the operations G and H are repeated in reverse order to store the 10 cm diameter wafers 1 in storage and manipulation boxes 4 or the support 10 is moved into a new tank for further chemical treatment or rinsing.

The use of the invention has been illustrated by way of example with reference to 10 cm diameter wafers 1 treated in an installation initially dedicated to treating 20 cm diameter wafers 2, but the invention can obviously be used with any other two dimensions of the wafers 1.

It follows from the foregoing description that a treatment installation and method according to the invention enable the use of several types of wafers 1 with different dimensions without having to change or adjust the transfer combs 27, the tanks 20 fitted with their wafer support rods 22, etc.

The invention being thus described, it will be apparent that the same may be varied In many ways. Such variations are not to be regarded as a departure from the spirit and scope of the invention, and all such modifications as would be recognized by the skilled artisan are intended to be included within the scope of the following claims.

What is claimed is:

1. An installation for treating wafers of a material used as a substrate for microelectronics, the installation comprising:
    a tank adapted to contain a treatment bath and provided with a wafer support device adapted to receive at least one wafer of a first size;
    a grasping element for grasping and placing each first size wafer in the tank and withdrawing said first size wafer therefrom; and
    a second support adapted to receive at least one wafer of a second size smaller than the first size, said second support having a geometry such that it can be grasped directly by the grasping element and received by the wafer support device of the tank.

2. The installation according to claim 1, wherein the second support includes at least one wafer-shaped holding plate.

3. The installation according to claim 2, wherein the second support includes two wafer-shaped holding plates each having a size substantially equal to said first size, said two plates being joined together by a support element adapted to retain a batch of second size wafers.

4. The installation according to claim 3, wherein the support element includes a plurality of bars.

5. The installation according to claim 3, wherein the batch of second size wafers is housed in a cassette and said support element is adapted to receive said cassette containing said second size wafers.

6. A method of treating wafers of materials used as substrates for microelectronics, comprising the steps of:

grasping a wafer of a first size with a grasping element and immersing said first size wafer in a treatment bath contained in a tank provided with a wafer support device adapted to receive said first size wafer;

using said grasping element to grasp a support support adapted to receive a wafer of a second size smaller than the first size; and immersing the second size wafer in the treatment bath by depositing said second support containing said second size wafer in said tank.

7. The method according to claim 6, wherein said step of immersing the second size wafer is preceded by a step of placing said second size wafer directly in the second support.

8. The method according to claim 6, wherein said step of immersing is preceded by a step of placing said second size wafer in a cassette and a step of placing said cassette in the support.

9. An installation for treating wafers made of a material used as a substrate for microelectronics, the installation comprising:

a tank adapted to contain a treatment bath and provided with wafer support means adapted to receive at least one wafer of a first size;

holding means adapted for grasping and placing each first size wafer in the tank and for withdrawing said first size wafer therefrom; and a second support adapted to receive at least one wafer of a second size smaller than the first size, said second support having geometry such that it can be grasped directly by the holding means and received by the wafer support means of the tank.

10. The installation according to claim 9, wherein the second support includes at least one wafer-shaped holding plate.

11. The installation according to claim 10, wherein the second support includes two wafer-shaped holding plates each having a size substantially equal to said first size, said two plates being joined together by a support element adapted to retain a batch of second size wafers.

12. The installation according to claim 11, wherein the support element includes a plurality of bars.

13. The installation according to claim 11, wherein the batch of second size wafers is housed in a cassette and said support element is adapted to receive said cassette containing said second size wafers.

14. A method of treating wafers of material used as substrates for microelectronics, which comprises:

grasping a wafer of a first size with holding means and immersing the wafer in a treatment bath;

receiving said wafer in wafer support means located in said treatment bath; and grasping a second support adapted to receive a wafer of a second size smaller than the first size with said holding means and immersing the second size wafer in the treatment bath by depositing said second support containing said second size wafer in said treatment bath.

15. The method of claim 14 which further comprises placing the second size wafer in the second support prior to immersing the second size wafer in the treatment bath.

16. The method of claim 14 which further comprises placing the second size wafer in a cassette and placing the cassette in the wafer support means prior to immersing the second size wafer in the treatment bath.

* * * * *

UNITED STATES PATENT AND TRADEMARK OFFICE
CERTIFICATE OF CORRECTION

PATENT NO. : 6,576,065 B1
DATED : June 10, 2003
INVENTOR(S) : Lamure

It is certified that error appears in the above-identified patent and that said Letters Patent is hereby corrected as shown below:

Column 2,
Line 20, delete "BRIEF DESCRIPTION OF THE INVENTION"; and
Between lines 51 and 52, insert the heading -- BRIEF DESCRIPTION OF THE DRAWINGS --.

Column 7,
Line 16, change "support support" to -- second support --.

Signed and Sealed this

Thirtieth Day of September, 2003

JAMES E. ROGAN
*Director of the United States Patent and Trademark Office*